United States Patent [19]

Forsberg

[11] 4,155,045
[45] May 15, 1979

[54] METHOD AND APPARATUS FOR DETECTION OF PHASE DIFFERENCE BETWEEN TWO ELECTRICAL SIGNALS

[75] Inventor: Gunnar S. Forsberg, Stockholm, Sweden

[73] Assignee: Telefonaktiebolaget L M Ericsson, Stockholm, Sweden

[21] Appl. No.: 828,417

[22] Filed: Aug. 29, 1977

[30] Foreign Application Priority Data

Sep. 15, 1976 [SE] Sweden .................................. 7610208

[51] Int. Cl.² ........................................... H03D 13/00
[52] U.S. Cl. ....................................... 328/133; 307/232
[58] Field of Search ................. 328/133, 155; 307/232

[56] References Cited

U.S. PATENT DOCUMENTS

| 3,328,688 | 6/1967 | Brooks | 328/133 X |
| 3,593,161 | 7/1971 | Ritz | 307/232 X |
| 3,600,690 | 8/1971 | White | 307/232 X |
| 3,986,128 | 10/1976 | Eriksson et al. | 328/133 |

*Primary Examiner*—John S. Heyman
*Attorney, Agent, or Firm*—Hane, Roberts, Spiecens & Cohen

[57] ABSTRACT

A sawtooth phase comparator comprising a bistable flip-flop is provided with a controlled 180° phase-shifter on one input so that a phase shift is carried out when the time between successive SET- and RESET pulses to the flip-flop is less than a given time, thereby improving the linearity of the output characteristic of the comparator.

7 Claims, 5 Drawing Figures

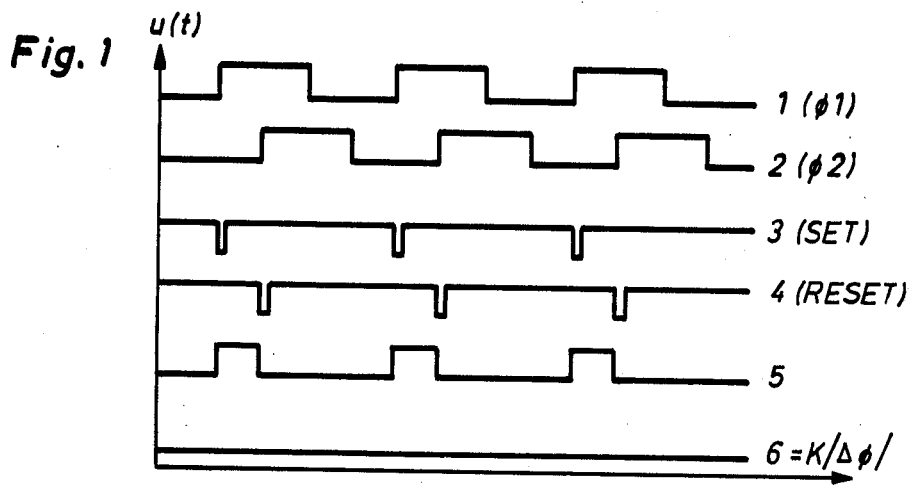
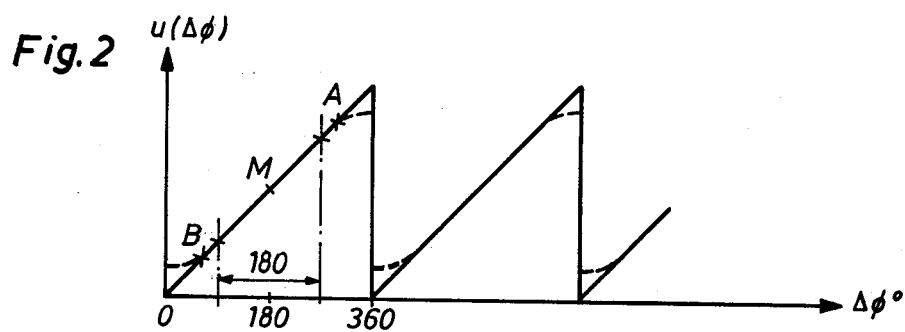
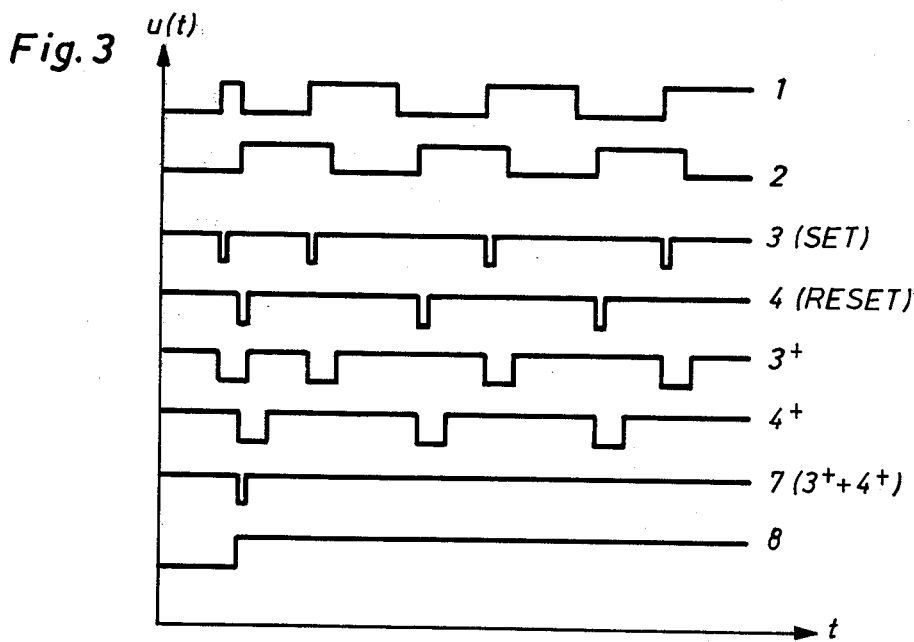

METHOD AND APPARATUS FOR DETECTION OF PHASE DIFFERENCE BETWEEN TWO ELECTRICAL SIGNALS

The present invention refers to a method and apparatus for the detection of the phase difference between two electrical signals. Such apparatuses are usually called phase comparators and the present comparator is of the so called sawtooth type to be used, for example, when measuring small frequency differences. Such a measurement is carried out, for instance, in phase-locked loops used with frequency stabilized signal generators.

The phase-locked loop constitutes a feed-back control system in which the error detector is constituted by the phase comparator which receives on one of its inputs a reference signal from a generator with a stable frequency. On its other input the comparator receives the feed-back signal of the system. The output voltage from the comparator is a direct current voltage whose magnitude is in general a function of the phase difference between the input signals. After filtering, this signal is used to influence a voltage controlled oscillator whose output signal of which constitutes the output signal of the overall system. This signal is also fed to the second input of the comparator according to the above.

A phase comparator of the sawtooth type is characterized by the fact that the output signal theoretically is a linear function of the phase difference between the input signals in an interval between two values of the phase difference and the output signal is then periodically repeated for greater and smaller values of this difference. Phase comparators of this type as well as phase-locked loops utilizing such comparators are previously known for example from The Bell System Technical Journal of March 1962.

In practice, however, it is not possible to achieve linearity in the output signal from the comparator for the whole of the phase difference interval 0°–360°. A frequency dependent distorsion affects the output signal characteristic near the limits of the interval and the non linear parts of the characteristic arising in this manner grow with increasing frequency.

It is previously known how to make the comparator independent of these effects by reversing the phase 180° of the one input signal when the output signal approaches a non linear interval. Certainly a voltage jump is obtained in the output signal when the phase is shifted but a better linearity is obtained in the separate angular intervals. Such a comparator is described in the Swedish Pat. No. 382.120. In order to initiate the phase shift of the one input signal there are in this apparatus provided two level sensing detectors of the Schmitt-trigger type connected to the output of the comparator through a low-pass filter. The sensing levels are chosen in such a way that they are clearly within the linear interval of the output signal characteristic.

A disadvantage of such a phase comparator, however, is, as will be shown below, that an optimal dimensioning from the point of view of bandwidth makes the comparator sensitive to phase jitter in the input signals, i.e. phase modulation of a random or a deterministic character in these signals.

An object of the present invention is to provide a phase comparator of the sawtooth type having a piecewise linear output signal characteristic and a frequency adaptive sensing level for the phase shift of one of the input signals.

The characteristics of the invention appear from the appended claims.

The advantages of a phase comparator according to the invention compared to apparatuses according to the known technique is a faster, in principle instantaneous, shift of the phase, a greater bandwidth and fewer components.

The invention will be described more in detail below in connection with the accompanying drawings in which:

FIG. 1 shows a number of signals constituting pulse trains in a phase comparator of a conventional type;

FIG. 2 shows the sawtooth-shaped output signal characteristic of a phase comparator;

FIG. 3 shows a number of signals constituting pulse trains in a phase comparator according to the invention;

Figure 4:
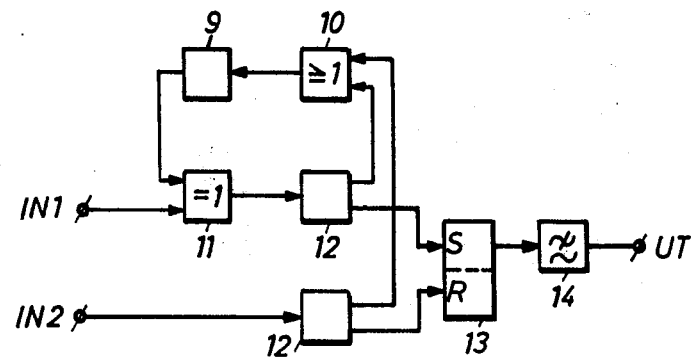
FIG. 4 shows an embodiment of the phase comparator according to the invention.

In FIG. 1 a number of signals in a conventional phase comparator of the sawtooth type is shown on a time axis. The two signals for example two sinusoidal signals, whose phases $\phi 1$, $\phi 2$ are to be compared are first converted to symmetrical square waves 1, 2 having the same frequency as the respective original signal. For the sake of simplicity the phase difference $\Delta \phi$ in the shown embodiment has been assumed to be constant i.e. the two signals 1, 2 have both the same frequency. By means of two flank triggered flip-flops, one for each input signal, the occurence of positive flanks in the two signals is detected. Each flip-flop gives on its output a train of short pulses 3, 4 marking the time position for the detected flanks. These pulses are fed to the SET- and the RESET-inputs of a SR-flip-flop respectively, the output signal 5 of which also is shown in the FIG. 1. A change in the phase difference $\Delta \phi$ between the input signals to the comparator consequently causes a change in the pulse-pause ratio of the output signal 5 of the SR-flip-flop and thus a change in the mean value for this signal. The mean value, which in principle is proportional to the phase difference between the input signals constitutes the output signal 6 from the comparator. If the phase $\phi 2$ of the input signal 2 is advanced, i.e. whose signal the positive flanks reset the SR-flip-flop, the mean value of the output signal 5 will increase until at coincidence of the SET- and RESET times there is a sudden stop to zero.

Operation according to the above would theoretically produce an output signal U as a function of the phase difference $\Delta \phi$ according to the continuous graph in FIG. 2. The overlapping effects arising between the SET- and the RESET-pulses respectively at phase differences near 360° or 0° as well as the fact that the SR-flip-flop has a certain rise time will, however, distort the output signal U according to what has been already indicated. The SET-RESET-pulses have a constant time-duration. When the frequency of the input signals is increased, this duration, however, corresponds to an increasing phase angle. Thus, the overlapping effects will be important at an increasing angle distance from those angles at which the voltage discontinuities appear in the output signal U and the linear interval of the characteristic decreases. The finite rise time of the output signal of the flip-flop prevents at higher frequencies the output signal from reaching its full logic level during the duration of the pulses which contributes to the distorsion in the output signal of the comparator.

As earlier mentioned a method is known to make the comparator independent of the effect of the distorsion by initiating, at certain levels in the output signal from the comparator, a phase shift of one of the input signals. The points A and B in FIG. 2 may represent two shift levels which are symmetrically arranged on both sides of the center M of the linear part of the characteristic. The shift implies that the operating point instantaneously jumps 180° along the graph. It is understood that the shift points cannot be arranged within an interval comprising 180° symmetrically around the center M if free running is to be avoided. Towards the end points of the saw-tooth graph the position of the shift points is on the other hand limited by the appearance of the nonlinearity. A design for a maximum bandwidth means that the points A and B are arranged outside but as close to the limits of the forbidden interval as possible. At low frequencies on the input signals this means that unnecessarily frequent discontinuities appear in the output signal when there is a frequency difference between the input signals. Furthermore closeness of the shifting points to the limits of the forbidden interval means that phase jitter can initiate a phase jump after which the operating point will be close to the opposite limit where the continued presence of phase jitter can initiate a quick rejump.

FIG. 3 illustrates the operation of a phase comparator according to the invention. The signals 1 and 2 are as in FIG. 1 digitized versions of the input signals to the phase comparator. The phase shift which is described in connection with FIG. 2 above has not been shown in FIG. 1. In FIG. 3, however, a phase shift is illustrated as well as its influence on the rest of the signals in the comparator. The pulse trains 3 and 4 mark as in the known apparatus the time position of positive flanks in the signals 1 and 2. Besides these signals in the method according to the invention, however, another two signals are now generated, these being binary pulse trains 3+ and 4+ respectively. The last mentioned pulses have negative pulse flanks coinciding with such flanks of the pulses of trains 3 and 4 respectively and furthermore a constant but considerably longer pulse duration than the pulses of trains 3 and 4. The pulses of trains 3+ and 4+ could each be generated for example by letting the pulses of trains 3 and 4 pass a pulse extending circuit.

A coincidence detection with reference to one of the levels in the pulses of trains 3+ and 4+ gives a response when the time interval between a positive flank in each of the pulses of trains 1 and 2 is shorter than the mutually equal pulse length in the signals 3+ and 4+. Such a coincidence detection can be arranged, as in the shown embodiment according to FIG. 3, by means of forming an OR-function between the signals 3+ and 4+. When the OR-condition is not satisfied this is indicated at the output of an OR-gate with a short pulse which pulse controls the phase shift of one of the input signals to the comparator, in this case the pulse train 1. Should the pulse trains 3+ and 4+ consist of positive pulses the coincidence detection is suitably arranged analogously by means of an AND-gate.

FIG. 4 shows an embodiment of the phase comparator according to the invention. The input signals IN1 and IN2 are digitized versions of the signals the phases of which are to be compared. When the latter signals are for example sinusoidal the signals IN1 and IN2 are symmetrical square voltages having magnitudes which are adapted to the logical levels of the connected circuits.

The pulse formers 12, which in connection with FIG. 5 will be described more in detail, provide on their outputs the above mentioned pulses trains 3, 3+ and 4, 4+ respectively. The signals or trains 3 and 4 are fed as in known apparatuses to the SET- and the RESET-inputs respectively of a SR-flip-flop 13. On the output of the low-pass filter 14 a signal corresponding to the signal 6 according to FIG. 1 is obtained.

In order to achieve the phase shift of the input signal IN1 this signal is connected to its pulse shaper 12 through an EXCLUSIVE-OR circuit 11. This circuit can be considered as a controlled inverter. When the input connected to circuit 9 has a low level the signal IN1 passes uninfluenced through the circuit while on the other hand a high level on this input gives a level shift i.e. a phase shift of 180°.

The two signals or trains of pulses 3+ and 4+ according to the above are each connected to an input of an OR-circuit 10, which on its output provides the signal 7 according to FIG. 3. The circuit 9 is a conventional single stage binary counter or a flank triggered flip-flop i.e. a circuit which output level for each new input signal pulse. When, consequently a pulse appears in the output signal 7 from the OR-circuit 10 indicating that the time interval between a positive flank in each of the signals IN1 and IN2 is smaller than the pulse length being chosen in advance in the pulse trains 3+ and 4+, the level change in the output signal 8 from the circuit 9 results in the desired phase shift.

It is understood from what is has been described above that according to the method of the invention the end parts of the characteristic are cut off according to FIG. 2 as far as time is concerned. Concerning the angle or the phase, this corresponds to increasing angle intervals when the input signal frequency increases. Consequently a frequency adaptive comparator is obtained in which the margin to nonlinearily automatically is maintained. The effective bandwidth of the comparator has consequently been increased relative to apparatuses having fixed sensing levels.

Figure 5:
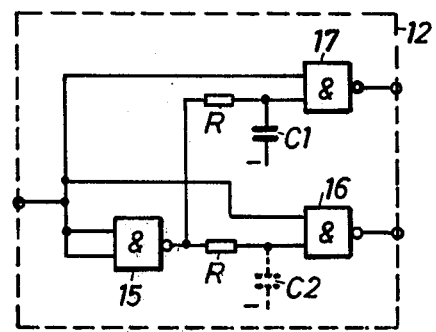
FIG. 5 shows a pulse former of the embodiment of FIG. 4 in detail.

FIG. 5 shows an embodiment of the pulse shaper 12 as used in to FIG. 4. The circuit has an input to which, for example, according to the above, a symmetrical square wave is applied. On the two outputs the occurrences of the positive flanks in the input signal shall be indicated as pulse trains. According to the above, the pulse trains shall have a constant but mutually different pulse duration. This is achieved by feeding the input signal in parallel on the one hand directly to one of the inputs of each of two inverted AND-circuits 16 and 17 and, on the other hand, after inversion in an inverted AND-circuit 15 and after delying to the other input of each of the circuits 16 and 17. The delaying is achieved regarding the circuit 16 by means of a RC-circuit consisting of a resistor R in series with the input and the inherent capacitance C2 of the input with respect to a negative polarity source. The delaying at the circuit 17 is achieved in principle in the same way but with the difference that a capacitance C1 is connected between the input and the negative polarity source.

In the steady state and when there is a low signal level at the input consequently the two outputs have a high signal level. A positive flank in the input signal will immediately change the signal level on the directly connected inputs of the circuits 16 and 17. The two different capacitances prevent, however, during a differently long time a signal level decrease on its associated inputs whereby two differently long pulses are achieved at the outputs of the circuits 16 and 17.

We claim:

1. In a phase comparator for comparing the phase difference between two trains of binary input signals by means of the setting of a bistable device by one of the input signals and the clearing of the bistable device by the other of the input signals wherein the output signal from the bistable device is a measure of the phase difference, the method of controllably inverting the polarity of one of the input signals comprising the steps of generating a first binary pulse train which is in synchronism with a particular characteristic of one of the trains of binary input signals, generating a second binary pulse train which is in synchronism with a particular characteristic of the other of the trains of binary input signals, the durations of the pulses in said pulse trains being fixed and independent of the frequencies of the trains of binary input signals, detecting the coincidence of one of the signal levels in the pulse trains, and whenever such coincidence is detected, changing the present polarity of one of the trains of binary input signals to the opposite polarity before the transmission thereof to the bistable device.

2. The method according to claim 1 wherein said particular characteristic is the occurrence of a pulse flank in a binary input signal.

3. The method according to claim 2 wherein said pulse flank has a particular polarity.

4. Apparatus for generating a signal whose instantaneous amplitude is a measure of the phase difference between two trains of binary input signals comprising: a bistable means having first and second inputs and an output for emitting a signal having a first level upon receipt of a signal at the first input and a signal having a second level upon receipt of a sight at the second input; a low-pass filter means connected to the output of said bistable means; controlled inverter means having a signal input, a signal output and a control input for inverting the phase of a signal received at the signal input when a control signal is present at the control input, said signal input being adapted to receive one of the two trains of binary input signals; first and second pulse generator means, each of said pulse generator means having an input and output means for generating in parallel a first pulse signal of a first width and a second pulse signal of a second and greater width for each pulse signal received at the input, the input of said first pulse generator means being connected to the output of said controlled inverter means, the input of said second pulse generator means being adapted to receive the other of the two trains of binary input signals, the output means of said first pulse generator means including means for transmitting the first pulse signals to the first input of said bistable means, the output means of said second pulse generator means including means for transmitting the first pulse signals to the second input of said bistable means, and the output means of each of said pulse generating means including means for emitting the second pulse signals; coincidence means including input means for receiving the second pulse signals from said first and second pulse generating means and an output means for emitting a trigger pulse whenever there is a coincidence between a second pulse signal received from said first pulse generating means and a second pulse signal received from said first pulse generating means; and control means responsive to the receipt of the trigger pulses for transmitting control signals to the control input of said controlled inverter means.

5. The apparatus of claim 4 wherein said control means comprises a single stage binary counter means having an input for receiving the trigger pulses and an output which switches between two signal levels in response to the receipt of a trigger pulse at the input.

6. The apparatus of claim 5 wherein said coincidence means is an OR-circuit and said second pulses are negative-going pulses.

7. The apparatus of claim 5 wherein said coincidence means is an AND-circuit and said second pulses are positive-going pulses.

* * * * *